United States Patent
Bowles et al.

(10) Patent No.: US 6,631,551 B1
(45) Date of Patent: Oct. 14, 2003

(54) METHOD OF FORMING INTEGRAL PASSIVE ELECTRICAL COMPONENTS ON ORGANIC CIRCUIT BOARD SUBSTRATES

(75) Inventors: Philip Harbaugh Bowles, Carmel, IN (US); Washington Morris Mobley, Carmel, IN (US); Richard Dixon Parker, Tipton, IN (US); Marion Edmond Ellis, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/105,611

(22) Filed: Jun. 26, 1998

(51) Int. Cl.[7] .............................................. H01C 17/06
(52) U.S. Cl. ............................ 29/620; 29/846; 29/848; 338/258; 338/308
(58) Field of Search ................................ 29/620, 610.1, 29/829, 830, 846, 576, 621, 832, 834, 847, 848, 851; 338/258, 308; 174/68.5; 156/664; 216/36, 55, 63, 42, 43, 72; 427/96

(56) References Cited

U.S. PATENT DOCUMENTS

| | | | |
|---|---|---|---|
| 4,241,103 A | * 12/1980 | Ohkubo et al. ............. 427/103 |
| 4,602,421 A | * 7/1986 | Lee et al. ..................... 29/576 |
| 4,687,543 A | * 8/1987 | Bowker ........................ 156/643 |
| 4,797,508 A | * 1/1989 | Chant ......................... 174/68.5 |
| 4,870,746 A | 10/1989 | Klaser ........................... 29/620 |
| 5,010,641 A | 4/1991 | Sisler ............................ 29/830 |
| 5,079,069 A | 1/1992 | Howard et al. .............. 428/209 |
| 5,116,641 A | * 5/1992 | Patel et al. .................... 427/96 |
| 5,155,655 A | 10/1992 | Howard et al. .............. 361/303 |
| 5,347,258 A | 9/1994 | Howard et al. .............. 338/333 |

FOREIGN PATENT DOCUMENTS

| JP | 90153589 | 6/1990 | ............ H05K/1/16 |
|---|---|---|---|
| JP | 6-14580 B2 | 2/1994 | ............ H05K/1/16 |

* cited by examiner

*Primary Examiner*—Peter Vo
*Assistant Examiner*—Donghai Nguyen
(74) *Attorney, Agent, or Firm*—Jimmy L. Funke; Stefan V. Chmielewski

(57) ABSTRACT

A process for forming stable integrated resistors (14) and capacitors (28) on organic substrates (12). The resistors (14) and capacitors (28) are capable of a wide range of resistance and capacitance values, yet can be processed in a manner that does not detrimentally effect the organic substrate (12) or entail complicated processing. The method generally entails the use of thick-film materials usually of the types used to form resistors and capacitors on ceramic substrates. The thick-film materials are applied to an electrically-conductive foil (20) and then heated to bond the thick-film material to the foil (20) and form a solid resistive or capacitive mass (16/30). The foil (20) is then laminated to an organic substrate (12), such that the resistive/capacitive mass (16/30) is attached to and preferably embedded in the organic substrate (12). Finally, the foil (20) is etched to form at least one of two terminals that contact the resistive/capacitive mass (16/30) and thereby complete the passive electrical component (14/28). Resistors (14) can also be formed of polymer thick-film (PTF) inks, in which case the PTF ink is cured on the foil (20) for an extended period at a temperature sufficient to completely cure the ink prior to laminating the foil (20) to the organic substrate (12).

20 Claims, 2 Drawing Sheets

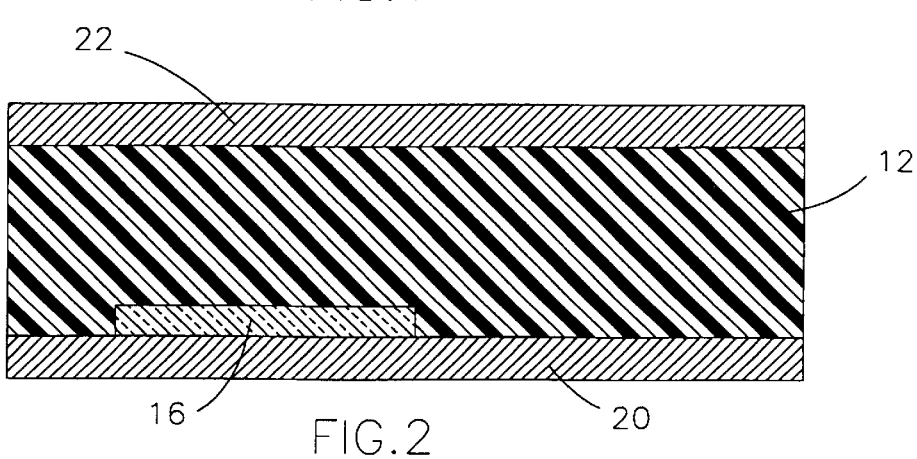
FIG. 1
FIG. 2
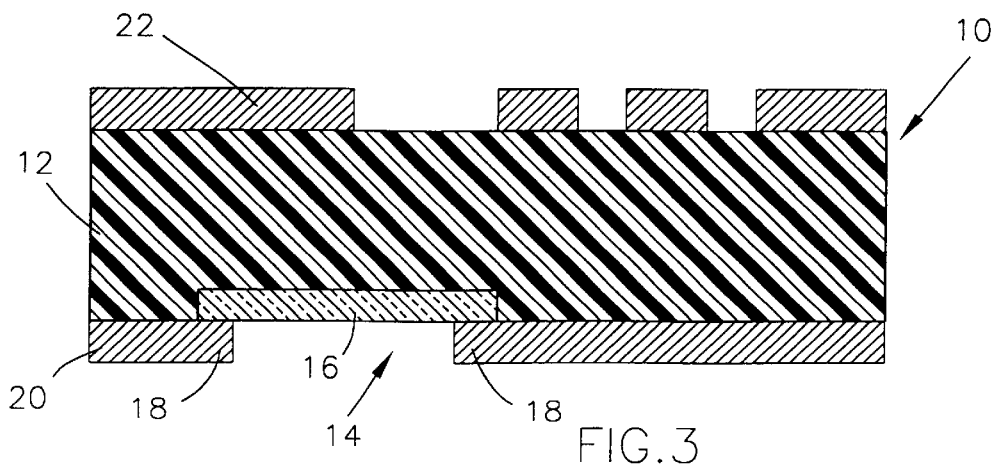
FIG. 3
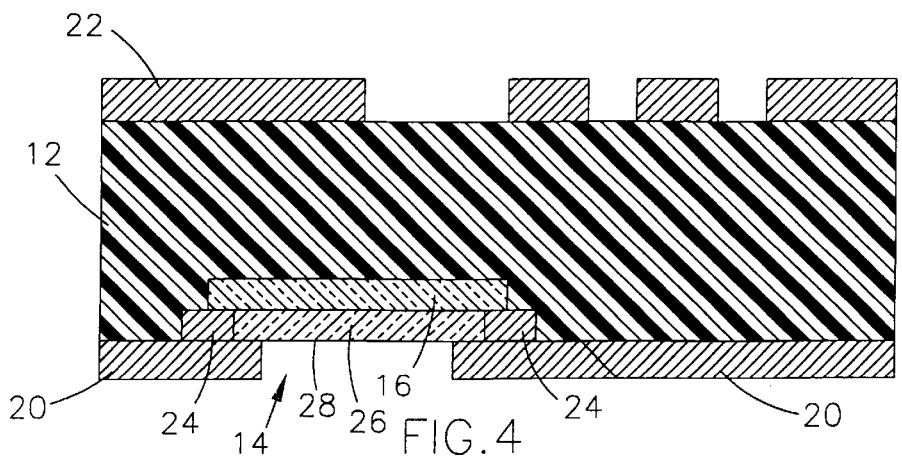
FIG. 4

METHOD OF FORMING INTEGRAL PASSIVE ELECTRICAL COMPONENTS ON ORGANIC CIRCUIT BOARD SUBSTRATES

FIELD OF THE INVENTION

The present invention generally relates to circuit boards and their fabrication. More particularly, this invention relates to a method for integrating stable resistive and capacitive materials with organic-based substrates, yielding resistors and capacitors that exhibit stability under temperature and humidity stress and over a wide range of resistance/capacitance values.

BACKGROUND OF THE INVENTION

Inorganic-based thick-film resistors are formed of materials that can provide a wide range of stable resistor values, and therefore have been widely used to replace discrete resistors on ceramic substrates of hybrid electronic circuits. Such resistors are formed by printing, such as screen printing, a thick-film resistive paste or ink that is typically composed of a glass frit composition, an electrically-conductive material, various additives used to favorably affect the final electrical properties of the resistor, and an organic vehicle. After printing, the ink is sintered or fired at a high temperature, typically about 850 to 900° C. The heating rate is controlled to first remove the organic vehicle, after which the glass frit composition is bonded together and to the ceramic substrate, forming a solid resistive mass that forms a thick-film resistor with a predictable and stable resistance when properly terminated. Other layers of material may then be printed over the resistor to yield a buried resistor in a multi-layer circuit board.

Thick-film inks of the type described above are fired at temperatures that organic substrates, such as those for printed wiring boards, cannot tolerate. Therefore, integrated resistors for organic substrates are typically formed from resistive materials such as NiP plated on copper which is subsequently laminated to the substrate, CrSi sputtered onto copper on polyimide, and polymer thick-film (PTF) inks that are printed on the substrate. PTF inks are generally composed of an electrically-conductive material (e.g., carbon) in an organic matrix material. After printing, PTF inks are heated to cure the matrix material to form an electrically-resistive film that adheres to the organic substrate. The temperature to which PTF materials must be heated is roughly about 200° C., which can be tolerated by organic substrates for a few minutes.

Processes required for organic substrates and their resulting integrated resistors have certain disadvantages as compared to resistors and processes for ceramic substrates. The NiP and CrSi materials are expensive and can be practically produced only with low sheet resistivities (up to about 1000 ohms/square). Consequently, large-value resistors must be very long, introducing electromagnetic interference (EMI) problems and occupying relatively large areas on or within the organic substrate. PTF resistors can be cost-effective but are relatively unstable because the organic matrix continues to cure during subsequent exposures to high temperatures (e.g., above 100° C.), causing drift in the resistance value. Extended cures at temperatures sufficient to eliminate this problem are not compatible with organic substrates.

In view of the above, it can be appreciated that integrated resistors that can be formed on organic substrates are often very large or less stable than integrated thick-film resistors formed on ceramic substrates. Similar differences can be seen between capacitors for ceramic and organic substrates. Stable integrated thick-film capacitors are formed on ceramic substrates using thick-film inks of high-dielectric constant (high $\epsilon_r$) materials (e.g., $BaTiO_3$, perovskites) and an organic vehicle, the latter of which is burned off during firing. For organic substrates, high-$\epsilon_r$ materials such as $BaTiO_3$ are mixed with organic binders such as epoxy to form a composite that can be deposited and cured to form a capacitor. High-$\epsilon_r$ materials and one of the capacitor electrodes may also be sputtered roll-to-roll onto copper on polyimide for organic substrates, or a high-$\epsilon_r$ film (such as polyimide with $BaTiO_3$) may have conductors sputtered onto both sides. Other deposition methods include vacuum deposition and solution coating. Lower $\epsilon_r$ organic (polymer) materials are deposited in thin layers and cured to form thin capacitors in organic substrates. In some applications, the low total capacitance of capacitors formed from lower-$\epsilon_r$ organic materials can replace enough discrete capacitors to be cost-effective. However, lower-$\epsilon_r$ organic materials generally cannot form small capacitors of appreciable capacitance values. Consequently, capacitors formed from these materials have found limited application, such as power filters where entire planes are formed of these materials to decouple power everywhere on a substrate.

The higher-$\epsilon_r$ materials mixed in organic matrix materials noted above achieve higher capacitance values, and can be quite effective for filtering power. However, capacitors used as filters on signals would be desirable, and for these applications only one of the electrodes (ground) can be in common, such that there is no benefit to be gained from sharing capacitance (as with power filtering). Considerable development would be required to make the higher-$\epsilon_r$ materials in organic matrices a suitable capacitor material for integrating discrete capacitors in organic substrates. Finally, sputtered high-$\epsilon_r$ materials, whether applied directly as an oxide or applied as a metal and anodized, currently suffer from defects in addition to having high material and processing costs.

From the above, it can be appreciated that resistors and capacitors have been integrated into ceramic substrates using inorganic-based materials and are able to have a wide range of stable resistance and capacitance values. However, the inorganic-based materials that provide these benefits have not been used with organic substrates because the high firing temperatures required are incompatible with organic substrates. Organic-based materials, whose processing temperatures (e.g., cure) are compatible with organic substrates, do not yield resistors and capacitors that are as stable as inorganic-based resistors and capacitors, and their relatively poor resistive and capacitive properties do not allow for stable resistance and high capacitance values. Accordingly, what is needed are stable resistors and capacitors that can be formed to have a wide range of resistance/capacitance values, yet can be integrated on organic substrates.

SUMMARY OF THE INVENTION

According to the present invention, there is provided a process for forming stable integrated resistors and capacitors on organic substrates. The resistors and capacitors are capable of a wide range of resistance and capacitance values, yet can be processed in a manner that does not detrimentally effect the organic substrate or entail complicated processing. Resistors and capacitors formed in accordance with this invention can be buried in a multi-layer circuit board.

The method of this invention generally entails the use of thick-film materials of the types used to form resistors and capacitors on ceramic substrates. The thick-film materials are applied to an electrically-conductive foil, such as a copper or stainless steel foil, and then heated to bond the thick-film material to the foil and form a solid mass. The solid mass will either be electrically resistive, capacitive or insulating, depending on the composition of the thick-film material. For example, the solid mass is electrically resistive if the thick-film material contains an inorganic composition, an electrically-conductive material, and an organic vehicle, but would be capacitive if the thick-film material contains a high-$\epsilon_r$ constituent. To be useful as a capacitor, the dielectric constant of the solid mass should be very high, such as with the $BaTiO_3$ family of materials. For a capacitor, a second conductor layer is applied to the solid mass such that the solid high-$\epsilon_r$ mass is sandwiched between with the conductive foil and the second conductor layer.

According to the invention, the conductive foil (with the solid mass and, if present, the second conductor layer) is then laminated to an organic substrate, such that the solid mass is attached to the organic substrate and preferably embedded in the organic substrate. The foil is etched to form at least one terminal that contacts the solid mass and thereby completes the passive electrical component. Finally, the resulting composite or core may be laminated with other layers of materials of the type used to form organic substrates. The sequence of layup of these materials may result in the passive electrical component being buried or remaining on the substrate surface.

In the above example, the thick-film material can essentially be the same as those used to form integrated inorganic-based resistors and capacitors on ceramic substrates, in which case the heating step entails firing the material to first burn off an organic vehicle and then bond the remaining material together and to the foil. Accordingly, the resulting resistor or capacitor is characterized by a stable resistance or capacitance value that is within a wide range of possible values. Alternatively, thick-film resistors and capacitors can be formed with PTF materials used in the prior art to form integrated resistors and capacitors on organic substrates. However, the instability of these resistors and capacitors noted with the prior art is overcome with this invention by performing the heating step as an extended cure at a temperature sufficient to completely cure the organic matrix prior to laminating the foil to the organic substrate. This feature of the invention also permits the use of other organic materials, such as polyimides, to be used as the matrix material for an organic-based resistor or capacitor of this invention.

In view of the above, it can be seen that high-temperature processing that would be incompatible with an organic substrate is only performed with resistive and capacitive materials, a foil such as copper that is relatively resistant to elevated processing temperatures, and any interface materials that might be included. Only then are the high-temperature materials laminated to an organic substrate, with subsequent processing of the organic substrate being limited to temperatures that the substrate will safely tolerate. Accordingly, the present invention provides the benefit of passive electrical components with stable, wide-ranged electrical properties as integrated components of an organic substrate. Advantages attributable to this capability include higher circuit densities, improved EMI performance, reduced circuit board size requirements, and lower production costs.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing, in which:

FIGS. 1 through 4 are cross-sectional views of a process for forming an integrated thick-film resistor on an organic substrate in accordance with this invention.

DETAILED DESCRIPTION OF THE INVENTION

Figure 5:
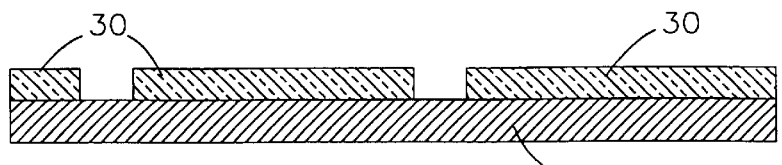
FIGS. 5 through 9 are cross-sectional views of a process for forming an integrated thick-film capacitor on an organic substrate in accordance with this invention.

Shown in FIG. 3 is a portion of a core 10 for a multi-layer circuit board, in which the core 10 has an organic substrate 12 and an integral thick-film resistor 14 formed in accordance with this invention. The substrate 12 can be any of a number of organic substrate materials known and used in the art, a particularly notable example of which is FR4, a glass-reinforced epoxy resin laminate available from various sources, such as Allied Signal Laminate Systems, Inc. A process for forming the resistor 14 is represented in FIGS. 1 through 3. An alternative configuration for a resistor formed in accordance with this invention is shown in FIG. 4. The resistor 14 is shown as having a resistive mass 16 terminated by copper terminations 18 formed by an etched copper foil 20. Those skilled in the art will appreciate that numerous variations and modifications are possible, and such variations and modifications are within the scope of this invention.

Referring to FIG. 1, the resistive mass 16 is shown as being formed directly on the copper foil 20, from which unneeded copper will be etched to leave the terminations 18. Though other electrically-conductive materials such as stainless steel could be used to form the terminations 18, copper foil is preferred because its low bulk resistivity (about 1.7 micro-ohmsβcm). According to this invention, the resistive mass 16 can be formed of an inorganic-based thick-film resistive ink composition, such as an ink composition of the type printed and fired on ceramic substrates to form integrated inorganic-based resistors. Such inorganic-based inks are well known in the art, and typically contain an inorganic composition, an electrically-conductive material, and an organic vehicle that enables the ink to be deposited by such methods as screen printing, stenciling or any other technique capable of depositing a controlled amount of ink on the foil 20.

Suitable inorganic compositions known in the art contain mixtures of glass frit that, upon firing, bond together to form an inorganic matrix for the electrically-conductive material. The electrically-conductive material can be iridium dioxide ($IrO_2$), ruthenium dioxide ($RuO_2$), a ruthenate or another suitable conductive material, while suitable organic vehicles include ethyl cellulose dissolved in terpineol. Possible additives include the noble metals and their compounds, refractory fillers, various glass frit materials, and modifiers. In a preferred embodiment, the electrically-conductive material is ruthenium dioxide in accordance with U.S. patent application Ser. No. 09/178,758, which is commonly assigned with the present invention and whose contents are incorporated herein by reference. Suitable ruthenium-based thick-films include those commercially available under the names 1650, 6221, 6231 and 6241 from E. I. Du Pont de Nemours, Co.

According to the present invention, the thick-film ink is fired on the copper foil 20 to burn off the organic vehicle, bond the inorganic composition together, and bond the resulting resistant mass 16 to the copper foil 20. Firing of inorganic-based thick-film inks is typically performed at temperatures of about 850 to 900° C. The organic vehicle burns off as the ink is heated, after which the inorganic matrix material is sintered at the peak firing temperature. Such temperatures are incompatible with organic materials of the type from the substrate 12 is formed. However, the present invention isolates the substrate 12 from the firing operation, thereby avoiding damage to the substrate 12. Importantly, the copper foil 20 must be fired in a nonoxidizing atmosphere, usually nitrogen, in order to avoid being oxidized into copper oxide and losing its high conductivity and low resistivity. According to the prior art, ruthenium-based resistor materials are reduced to metallic ruthenium at temperatures above about 350° C. if not processed in an oxygen atmosphere, which would make the use of the preferred ruthenium dioxide impractical for use in the present invention. However, in accordance with U.S. patent application Ser. No. 09/178,758, a ruthenium-based resistor ink can be fired on the copper foil 20 in a nitrogen atmosphere if the organic vehicle in the ink is first burned off at a temperature below 350° C. in an oxygen-containing atmosphere. A suitable organic vehicle capable of burning off at such low temperatures is commercially-available under the name CERDEC 1562 from Ferro Corporation. After the organic vehicle is burned off, the copper foil 20 and resistive mass 16 are placed in a nitrogen atmosphere and heated to a temperature sufficient to sinter the resistive mass 16, e.g., about 850 to 900° C. Surprisingly, and contrary to prior art teachings, the ruthenium compound of the thick-film resistor ink is not reduced to metallic ruthenium in the nitrogen atmosphere. The result is a highly stable nitrogen-fired ruthenium-based resistive mass 16 on an unoxidized copper foil 20.

The present invention also encompasses the use of polymer thick-film (PTF) inks to form the resistive mass 16. Suitable PTF inks known in the art generally contain a particulate conductive filler dispersed in an organic matrix material and possibly additives that are used to affect the final electrical properties of the resistors Such inks are deposited by screen printing, stenciling, and other suitable techniques. Preferred ink compositions known in the art contain carbon and/or silver particles as the conductive filler dispersed in a heat-curable polymer, such as an epoxy or polyimide-based resin. Other preferred materials may contain intrinsically-conductive polymer additives.

According to the present invention, the PTF inks are subjected to a thermal treatment on the copper foil 20 at a temperature sufficient to completely cure the matrix material and bond the resulting resistant mass 16 to the copper foil 20. In the past, absolute and complete curing of the organic matrix of a PTF ink was not possible because the required cure temperatures and durations are incompatible with organic materials of the type used to form the substrate 12. However, because the present invention isolates the substrate 12 from the curing operation, sufficient temperatures and durations can be employed to fully cure the organic binder without concern for the substrate 12.

In FIG. 2, the copper foil 20 is shown as having been laminated to the substrate 12 to which a second copper foil 22 was simultaneously laminated. As shown, the resistive mass 16 is preferably embedded in the substrate 12. Lamination can be by conventional methods at typical temperatures of about 140° C. to about 200° C., or even higher for some materials. FIG. 3 shows the result of etching the copper foils 20 and 22 to form the terminations 18 and runners on the substrate 12. In this manner, the edges of the terminations 18 are photodefined such that the electrical length of the resistor 14 can be accurately determined. The resistive mass 16 may be trimmed in accordance with known practices to more precisely obtain the desired resistance value for the resistor 14. Additional cores can be laminated to the core 10 to yield a multi-layer circuit board in which the resistor 14 can be on a surface layer or an inner layer (buried).

FIG. 4 is an alternative embodiment that includes optional separate printed copper terminations 24 between the resistive mass 16 and the copper foil 20 and an undercoat 26 that protects the resistive mass 16 during etching of the copper foil 22.

Figure 7:
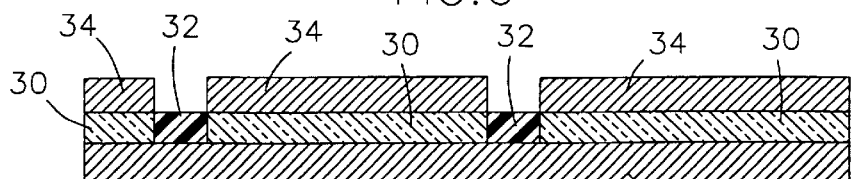
Figure 8:
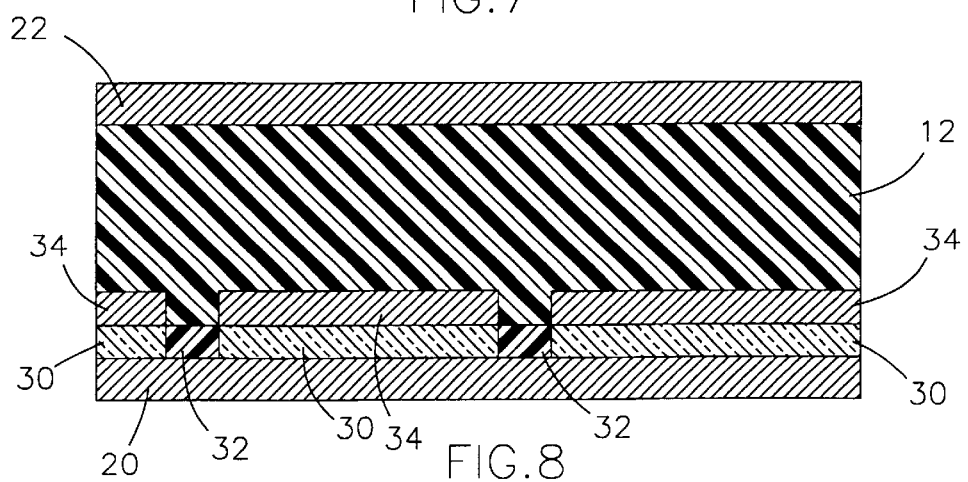
Figure 9:
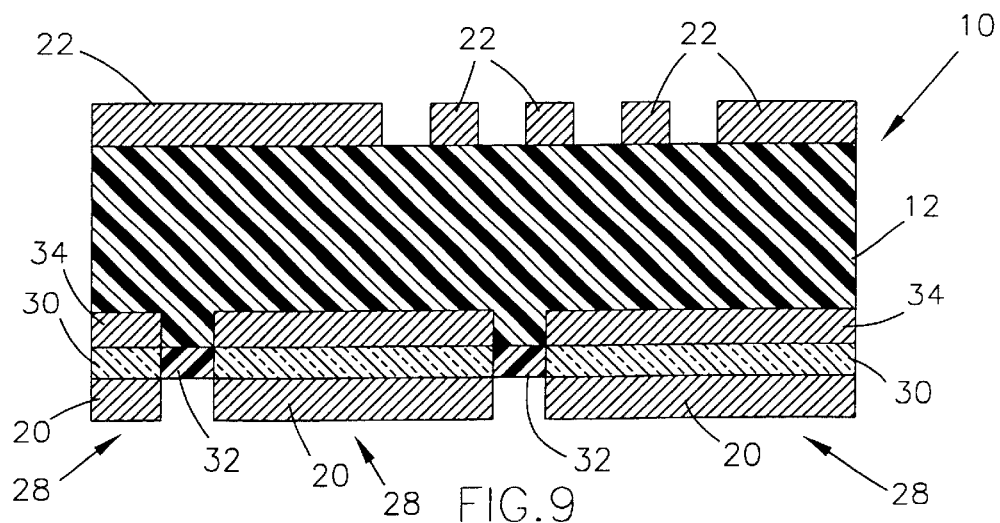

A process for forming capacitors 28 in accordance with this invention is represented in FIGS. 5 through 9. This process is similar to the process described above for the resistor 14, and will be described in reference to the substrate 12. As shown in FIG. 9, each of the capacitors 28 generally includes a high-$\epsilon_r$ mass 30 with copper terminals formed by the etched copper foil 20 and a printed copper pattern 34.

Figure 6:

Referring to FIG. 5, the high-$\epsilon_r$ masses 30 are shown as being formed directly on the copper foil 20, as was the resistive mass 16 for the resistor 14. According to this invention, the high-$\epsilon_r$ masses 30 are formed of an inorganic-based thick-film dielectric ink of the type printed and fired on ceramic substrates to form integrated inorganic-based capacitors. Such inorganic-based inks are well known in the art, and typically contain an inorganic composition and an organic vehicle that enables the ink to be deposited by such methods as screen printing, stenciling or any other technique capable of depositing a controlled amount of ink on the copper foil 20. Suitable inorganic compositions known in the art contain mixtures of glass frit that bond together during firing at temperatures of about 850 to 900° C. Suitable organic vehicles include ethyl cellulose dissolved in terpineol. The ink can be blanket coated onto the copper foil 20, or can be patterned as indicated in the Figures to allow a different, low-$\epsilon_r$ material 32 to be applied between the high-$\epsilon_r$ masses 30, as shown in FIG. 6. The low-$\epsilon_r$ material 32 is useful as an insulating material for areas that will become vias and to minimize coupling between the individual capacitors 28. The dielectric inks for the high-$\epsilon_r$ masses 30 and low-$\epsilon_r$ material 32 can be applied in any order. Alternatively, the low-$\epsilon_r$ material 32 may be omitted, allowing the substrate 12 to fill those spaces between the high-$\epsilon_r$ masses 30 during the lamination process.

According to the present invention, the thick-film ink for the high-$\epsilon_r$ masses 30 is fired on the copper foil 20 to burn off the organic vehicle, bond the inorganic composition together, and bond each of the resulting high-$\epsilon_r$ masses 30 to the copper foil 20. As with the resistive mass 14, the dielectric thick-film ink is typically fired in an inert or nitrogen atmosphere to prevent oxidation of the copper foil 20. After deposition of the low-$\epsilon_r$ ink, a second firing operation is performed to form the low-$\epsilon_r$ material 32 (if used). The printed copper pattern 34 is then formed by screening an appropriate copper ink onto the high-$\epsilon_r$ masses 30, and then firing in a nitrogen atmosphere to form one set of the terminals for the capacitors 28, as depicted in FIG. 7. Alternatively, instead of the copper pattern 34, a second copper foil (not shown) could be processed to have complementary high-$\epsilon_r$ masses in the manner done for the copper foil 20 (FIG. 6), and then laminated to the copper foil 20 with their high-$\epsilon_r$ masses aligned and mated. After lamination, the second copper foil would be etched to yield a structure similar in appearance to that shown in FIG. 7.

In FIG. 8, the copper foil 20 with the adhered high-$\epsilon_r$ masses 30 and copper pattern 34 is shown as having been laminated to the substrate 12, which again includes a second copper foil 22. Lamination again can be by conventional methods, with the copper pattern 34 preferably embedded in the substrate 12. FIG. 9 shows the result of etching the copper foils 20 and 22, the former defining the second set of terminals for the capacitors 28 and the latter forming runners, etc., on the substrate 12. Etching of the copper foil 20 can be more selective than shown in FIG. 9 to form multiple capacitors with one common termination (e.g., electrical ground). Additional cores can be laminated to the core 10 to yield a multi-layer circuit board.

While our invention has been described in terms of particular embodiments, it is apparent that other forms could be adopted by one skilled in the art. Accordingly, the scope of our invention is to be limited only by the following claims.

What is claimed is:

1. A method of forming a passive electrical component in an organic circuit board, the method comprising the steps of:
    providing a thick-film material chosen from the group consisting of electrically-resistive and dielectric compositions;
    applying the thick-film material to an electrically-conductive foil;
    heating the thick-film material to a temperature above what the organic circuit board can tolerate so as to bond the thick-film material to the foil and form a solid mass having an electrical property chosen from the group consisting of electrical resistance and dielectric;
    laminating the foil with the solid mass bonded thereto to the organic circuit board so as to attach the solid mass to the organic circuit board; and then
    etching the foil to form at least one of two terminals that contact the solid mass to yield a passive electrical component.

2. A method as recited in claim 1, wherein the thick-film material is an electrically-resistive thick-film ink comprising an inorganic composition, an electrically-conductive material, and an organic vehicle, and the solid mass is an electrically-resistive mass after the heating step.

3. A method as recited in claim 2, wherein the heating step entails firing the thick-film ink at a temperature sufficient to remove the organic vehicle and then sinter the inorganic composition.

4. A method as recited in claim 1, wherein the thick-film material is an electrically-resistive ruthenium-based thick-film ink containing an organic vehicle, and the solid mass is an electrically-resistive mass after the heating step.

5. A method as recited in claim 4, wherein the heating step entails heating the ruthenium-based thick-film ink in an oxygen-containing atmosphere to a temperature of less than 350° C. to remove the organic vehicle, and then further heating the ruthenium-based thick-film ink in a non-oxidizing atmosphere to a temperature sufficient to sinter the thick-film ink to yield the electrically-resistive mass.

6. A method as recited in claim 1, wherein the thick-film material is an electrically-resistive polymer thick-film ink comprising an electrically-conductive material dispersed in an organic matrix material.

7. A method as recited in claim 6, wherein the heating step entails heating the polymer thick-film ink at a temperature sufficient to completely cure the organic matrix material.

8. A method as recited in claim 6, wherein the electrically-conductive material is chosen from the group consisting of carbon, silver and conductive polymers.

9. A method as recited in claim 6, wherein the organic matrix material is chosen from the group consisting of epoxy-based and polyimide-based polymer compositions.

10. A method as recited in claim 1, wherein the thick-film material is an electrically-capacitive thick-film ink comprising an inorganic dielectric composition and an organic vehicle, and wherein the solid mass is a capacitive mass after the heating step, the method further comprising the step of forming a conductor pattern over the capacitive mass to form a second terminal of the two terminals.

11. A method as recited in claim 10, further comprising the step of depositing a dielectric material on the foil adjacent the capacitive mass prior to the laminating step, heating the dielectric material to bond the dielectric material to the foil and form a dielectric layer, and then forming the conductor pattern over the dielectric layer and the capacitive mass.

12. A method as recited in claim 10, wherein the laminating step embeds the conductor pattern in the organic circuit board.

13. A method as recited in claim 10, wherein the heating step entails firing the thick-film ink at a temperature sufficient to remove the organic vehicle and sinter the inorganic dielectric composition.

14. A method as recited in claim 1, wherein the applying step entails screen printing the thick-film material on the foil.

15. A method as recited in claim 1, wherein the laminating step embeds the solid mass in the organic circuit board.

16. A method of forming a passive electrical component in an organic circuit board, the method comprising the steps of:
    providing a thick-film ink chosen from the group consisting of electrically-resistive and dielectric compositions, the thick-film ink comprising an inorganic composition and an organic vehicle;
    screen printing the thick-film ink on a conductive foil;
    firing the thick-film ink at a temperature sufficient to remove the organic vehicle from the thick-film ink, sinter the inorganic composition to form an inorganic solid mass, and bond the inorganic solid mass to the conductive foil, the inorganic solid mass having an electrical property chosen from the group consisting of electrical resistance and dielectric;
    laminating the conductive foil with the inorganic solid mass bonded thereto to the organic circuit board so that the inorganic solid mass is between the conductive foil and the organic circuit board; and then
    etching the conductive foil to form at least one of two terminals that contact the inorganic solid mass and thereby yield a passive electrical component.

17. A method as recited in claim 16, wherein the thick-film ink is an electrically-resistive thick-film ink further comprising an electrically-conductive material, and the inorganic solid mass is an electrically-resistive mass embedded in the organic circuit board after the laminating step.

18. A method as recited in claim 17, wherein the conductive foil is copper and the electrically-conductive material is a ruthenium-based compound, and wherein the firing step entails heating the thick-film ink in an oxygen-containing atmosphere to a temperature of less than 300° C. to remove the organic vehicle, and then further heating the thick-film ink in a nitrogen atmosphere to a temperature sufficient to sinter the inorganic composition and yield the electrically-resistive mass.

19. A method as recited in claim 16, wherein the thick-film material is an electrically-capacitive thick-film ink and wherein the inorganic solid mass is a capacitive mass after the firing step, the method further comprising the step of forming a conductor pattern over the capacitive mass to form a second terminal of the two terminals, the second terminal being embedded in the organic circuit board after the laminating step.

20. A method as recited in claim 19, further comprising the step of depositing a dielectric material on the conductive foil adjacent the capacitive mass prior to the laminating step, heating the dielectric material to bond the dielectric material to the conductive foil and form a dielectric layer, and then forming the conductor pattern over the dielectric layer and the capacitive mass.

* * * * *